(12) United States Patent
Madan et al.

(10) Patent No.: US 7,193,880 B2
(45) Date of Patent: Mar. 20, 2007

(54) PLATELINE VOLTAGE PULSING TO REDUCE STORAGE NODE DISTURBANCE IN FERROELECTRIC MEMORY

(75) Inventors: Sudhir Kumar Madan, Richardson, TX (US); John Fong, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/866,834

(22) Filed: Jun. 14, 2004

(65) Prior Publication Data

US 2005/0276089 A1    Dec. 15, 2005

(51) Int. Cl.
    *G11C 11/22*   (2006.01)
(52) U.S. Cl. .................. 365/145; 365/230.03
(58) Field of Classification Search ........... 365/145, 365/189.09
    See application file for complete search history.

(56) References Cited

U.S. PATENT DOCUMENTS

| | | | | |
|---|---|---|---|---|
| 5,524,093 | A * | 6/1996 | Kuroda ................... | 365/145 |
| 6,038,162 | A * | 3/2000 | Takata et al. ............ | 365/145 |
| 6,046,928 | A | 4/2000 | Takata | |
| 6,208,550 | B1 | 3/2001 | Kim | |
| 6,366,489 | B1 * | 4/2002 | Salling ................... | 365/145 |
| 6,487,103 | B2 | 11/2002 | Yamamoto et al. | |
| 6,493,251 | B2 | 12/2002 | Hoya et al. | |
| 6,510,073 | B1 | 1/2003 | Lee et al. | |
| 6,661,697 | B2 | 12/2003 | Yamamoto et al. | |
| 6,667,896 | B2 | 12/2003 | Rickes et al. | |
| 2003/0031042 | A1 | 2/2003 | Yamamoto et al. | |
| 2003/0103372 | A1 | 6/2003 | Matsushita | |
| 2003/0174532 | A1 | 9/2003 | Matsushita et al. | |
| 2003/0206430 | A1 | 11/2003 | Ho | |

OTHER PUBLICATIONS

U.S. Appl. No. 10/717,146, filed Nov. 18, 2003, Madan.
U.S. Appl. No. 10/748,041, filed Dec. 29, 2003, Madan.
U.S. Appl. No. 10/805,809, filed Mar. 22, 2004, Madan et al.
U.S. Appl. No. 10/847,412, filed May 17, 2004, Summerfelt et al.
"A Bit-Line GND Sense Technique for Low-Voltage Operation FeRAM", Shoichiro Kawashima, Toru Endo, Akira Yamamoto, Ken'ichi Nakabayashi, Mitsuharu Nakazawa, Keizo Morita and Masaki Aoki, 2001 Symposium on VLSI Circuits Digest of Technical Papers, pp. 127 & 128.
"A Survey of Circuit Innovations in Ferroelectric Random-Access Memories", Ali Sheikholeslami and P. Glenn Gulak, Proceedings of the IEEE, vol. 88, No. 5, May 2000, pp. 667-689.

* cited by examiner

*Primary Examiner*—Thong Q. Le
(74) *Attorney, Agent, or Firm*—Jacqueline J. Garner; W. James Brady, III; Frederick J. Telecky, Jr.

(57) ABSTRACT

Methods (50, 70) and ferroelectric devices (102) are presented, in which pulses (113) are selectively applied to platelines (PL) of one or more non-selected ferroelectric memory cells (106) during memory access operations to mitigate cell storage node disturbances.

18 Claims, 13 Drawing Sheets

PLATELINE VOLTAGE PULSING TO REDUCE STORAGE NODE DISTURBANCE IN FERROELECTRIC MEMORY

FIELD OF INVENTION

The present invention relates generally to semiconductor devices and more particularly to improved methods and apparatus for reducing storage node disturbance in ferroelectric memory devices.

BACKGROUND OF THE INVENTION

In semiconductor memory devices, data is read from or written to memory cells in the device according to decoded address information and various other control signals. Such memory devices are used for storage of data and/or program code in personal computer systems, embedded processor-based systems, video image processing circuits, communications devices, and the like. Ferroelectric memories store data in ferroelectric capacitors, and are commonly organized in single-transistor, single-capacitor (1T1C) or two-transistor, two-capacitor (2T2C) configurations. In a folded bitline 1T1C architecture, the individual ferroelectric memory cells typically include a ferroelectric (FE) capacitor adapted to store a binary data bit, together with a MOS access transistor, which operates to selectively connect the FE capacitor to one of a pair of complementary bitlines, with the other bitline being connected to a reference voltage for read operations. The individual cells are commonly organized as individual bits of a corresponding data word, where the cells of a given word are accessed concurrently by activation of platelines and wordlines by address decoding control circuitry.

Ferroelectric memory devices provide non-volatile data storage where the cell capacitors are constructed using ferroelectric dielectric material that may be polarized in one direction or another in order to store a binary value. The ferroelectric effect allows for the retention of a stable polarization in the absence of an applied electric field due to the alignment of internal dipoles within perovskite crystals in the ferroelectric material. This alignment may be selectively achieved by application of an electric field in a first direction that exceeds a coercive field of the material. Conversely, reversal of the applied field reverses the internal dipoles, wherein the response of the polarization of a ferroelectric capacitor to the applied voltage may be plotted as a hysteresis curve.

Data in a typical ferroelectric data cell is read by connecting a reference voltage to a first bitline, and connecting the cell capacitor between a complementary bitline and a plateline pulse signal. This provides a differential voltage on the bitline pair, which is connected to a differential sense amp circuit. The reference voltage is typically supplied at an intermediate voltage between the voltage associated with a capacitor storing a binary "0" and that of the capacitor storing a binary "1". The polarity of the sensed differential voltage thus represents the data stored in the cell, which is buffered by the sense amp and provided to a pair of local IO lines. The transfer of data between the ferroelectric memory cell, the sense amp circuit, and the local data bitlines is controlled by various access transistors, typically MOS devices, with switching signals being provided by control circuitry including address decoders and timing circuits in the device.

Connection of the ferroelectric cell capacitor between an activated plateline and the bitline during a read operation causes an electric field to be applied to the cell capacitor. If the field is applied in a direction to switch or reverse the internal dipoles, more charge will be moved than if the dipoles are not reversed. As a result, the sense amplifier can measure the charge applied to the cell bitlines and produce either a logic "1" or "0" differential voltage at the sense amp terminals. Since reading the cell data is a destructive operation, the sensed data is then restored to the cell following each read operation by application of another pulse to the cell platelines while the sense amp is enabled. To write data to the cell, an electric field is applied to the cell capacitor by a sense amp or write buffer in combination with a plateline activation pulse to polarize the capacitor to the desired data state. Ferroelectric memories provide certain performance advantages over other forms of non-volatile data storage devices, such as flash and EEPROM type memories. For example, ferroelectric memories offer short programming (e.g., write access) times and low power consumption.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a write operation, row decoder control circuitry provides a plateline pulse signal to the first sides of the ferroelectric cells in a data row, the other sides of which are connected to the array bitlines to receive the data. In a read operation, the decoder provides plateline pulses to the first side of each ferroelectric memory cell in a data row, and sense amplifiers are connected to the other side of the cells to sense a row of stored data bits in parallel fashion. Thus, in a single read operation, an entire row of data bits (e.g., 8, 16, 32, or 64 bits) are obtained from the memory cells in the selected row.

FIGS. 1A–1C illustrate a portion (e.g., a 32 k segment) of a ferroelectric memory device 2 organized in a folded bitline architecture, including a segment in FIG. 1A with 512 rows (words) and 64 columns (bits) of data storage cells 6 indicated as $C_{ROW-COLUMN}$, where each column of cells 6 is accessed via a pair of complementary bitlines $BL_{COLUMN}$ and $BL_{COLUMN}'$. In the first row of the device 2, for example, the cells C1-1 through C1-64 form a 64 bit data word accessible via complementary bitline pairs BL1/BL1' through BL64/BL64' by activation of a wordline WL1. The cell data is sensed during data read operations using sense amp circuits 12 (S/A C1 through S/A C64) associated with columns 1 through 64, respectively. As illustrated further in FIG. 1B, an exemplary cell 6a is formed as a 1T1C cell including a single ferroelectric cell capacitor and an access transistor 10a to connect the cell capacitor $C_{FE}1$ between one of the complementary bitlines BL1 associated with the cell column and a plateline PL1. During memory accesses, the other bitline BL1' is selectively connected to a reference voltage generator 8 or 8' via one of a pair of switches 8a, 8b (FIG. 1A), depending upon which word is being accessed.

In the device 2, cells along WL1 and WL2 (as well as those along WL5, WL6, WL9, WL10, . . . , WL509, WL510) are coupled with bitlines BL1-BL64, whereas cells along WL3 and WL4 (as well as those along WL7, WL8, WL11, WL12, . . . , WL511, WL512) are coupled with bitlines BL1'-BL64'. In reading the first data word along the wordline WL1, the cells C1-1 through C1-64 are connected to the sense amps via the bitlines BL1, BL2 . . . , BL63, and BL64 while the complementary reference bitlines BL1', BL2' . . . , BL63', and BL64' are connected to the reference voltage generators 8, 8'. FIG. 1C provides a simplified timing diagram 20 showing waveforms or signals on various nodes during a read and restore operation in the device 2 to access cells along WL1.

During a read operation, a signal level $V_1$ or $V_0$ is obtained on the array bitline BL1, depending upon the state of the data being read from the cell 6a(e.g., binary "1" or "0", respectively). A reference voltage $V_{REF}$ from the shared reference generators 8, 8' is ideally between $V_1$ and $V_0$, which is applied to the complementary bitline BL1' (e.g., the other input of the sense amp 12). To read the data stored in the cell, the transistor 10a is turned on by applying a wordline activation voltage Vwl which is typically greater than or equal to a supply voltage Vdd plus a threshold voltage of the transistor 10a via the wordline WL1 to couple the bitline BL1 to the capacitor $C_{FE}1$. The plateline PL1 is then pulsed high, as illustrated in FIG. 1C, to cause charge sharing between the ferroelectric capacitor $C_{FE}1$ and the capacitance of the bitline BL1, by which the bitline voltage BL1 rises, depending upon the state of the cell data being read.

The plateline PL1 is then returned to 0V and the sense amp 12 is activated via a sense amp enable signal SE. One input terminal of the sense amp 12 is coupled to the cell bitline (e.g., data bitline BL1) and the other differential sense amp input is coupled to a reference voltage (e.g., reference bitline BL1' in this example). In the example of FIGS. 1A–1C, the sense amp 12 is enabled after the plateline signal PL1 is again brought low, a technique referred to as "pulse sensing". Alternatively, "step sensing" can be used in the device 2, in which the sense amp is enabled via the SE signal while the plateline pulse PL1 is still high. Following a cell data read, the data is restored to the cell 6a by again pulsing the plateline high and then low while the wordline WL1 is asserted to reprogram the cell capacitor $C_{FE}1$.

Recently, ferroelectric memory devices have been proposed, in which several adjacent cell platelines are connected to a single common plateline driver in a segment, in order to conserve driver area in the device. These groups of cells form a plate group, for example, where a memory array segment of 512 rows (e.g., 512 wordlines) may have cells along wordlines WL1 through WL64 driven by a single plateline driver, with other portions of the segment forming separate plate groups of 64 rows each. Also, wordline driver circuit area may be conserved by providing common wordline drivers shared among several or all segments in a section within a memory device. For example, a 6M FeRAM may consist of 12 sections (1 through 12) and each section may have 16 segments (1 through 16) of 32K memory arrays.

In a shared plateline driver configuration, accessing a selected target row in an array segment may cause unwanted charging or discharging of storage nodes (e.g., storage node disturbance) associated with unselected cells within the selected plate group, or other cells in non-selected plate groups, typically by current leakage of the unselected cell transistor. This unwanted storage node charging or discharging can also occur in non-shared plateline configurations as well. Such unintended charge transfer can degrade signal margins required to accurately and repeatably sense the data stored in ferroelectric memory cells.

In FIG. 1B, the storage node of the cell 6a is the connection between the cell capacitor $C_{FE}1$ and the cell transistor 10a. When the selected cell 6a is read (e.g., along with other cells 6 along WL1), pulsing the plateline PL1 high causes a voltage to develop on the bitline BL1 because the cell capacitor $C_{FE}1$ discharges through the pass gate transistor 10a to the bitline BL1. Once the bitline signal is amplified by the sense amp 12 during a write or restore operation, the bitline goes high to Vdd or low to Vss, depending on whether the data being written is a binary "1" or a "0", respectively. Where the cell 6a is not selected for a read or write access (e.g., WL1 is low and transistor 10a is theoretically off), and the cell 6a is not in a selected plate group, accesses to the segment along the bitline BL1 cause the bitline voltage to rise. If the cell transistor 10a leaks, the storage node of the non-accessed cell 6a can acquire charge (voltage) while the associated plateline PL1 is low, for example, where the data on the bitline BL1 is a "1" (e.g., BL1 is at a high voltage such as Vdd), due to leakage through the cell transistor 10a.

This form of storage node disturbance is possible in both types of ferroelectric memory devices that do or do not employ shared plateline drivers. As long as the voltage is above 0V on BL1, the storage node for the cell 6a can gain charge. Even while reading a "0" data, the voltage on the BL1 can rise above 0V as illustrated in FIG. 1C, resulting in a rise or gain in storage node voltage for the cell 6a. After an access is complete and the bitlines have returned to a precharged state of 0V, the storage nodes, if their voltage is non-zero, would tend to discharge that voltage to the bitlines because of transistor leakage. However, any gain in voltage may not be fully discharged before the beginning of a next cycle and during a time when a segment is repeatedly accessed and these charge gain disturbances can accumulate over a number of cycles, thereby decreasing the signal margin of the system, and possibly depolarizing the cell capacitor $C_{FE}1$ from its intended (e.g., programmed) state. Furthermore, such storage node disturbances may be worsened through wordline coupling that temporarily raises the wordline voltage of WL1 while a different (adjacent) row is being accessed. Consequently, there is a need for improved ferroelectric memory devices and techniques by which cell storage node disturbances can be mitigated or avoided.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides methods and ferroelectric devices, in which pulses are selectively applied to one or more non-selected platelines of ferroelectric memory cells during memory access operations to mitigate cell storage node disturbances, by which ferroelectric memory data integrity and corresponding signal margins can be improved or maintained. The invention may be implemented in any array architecture, including open and folded bitline configurations, and may be employed in devices having any cell type, such as 1T1C, 2T2C, etc. Furthermore, the present invention may be employed in conjunction with ferroelectric devices in which groups of array platelines are driven by shared plateline drivers (e.g., plate groups) or in devices having individual drivers for each plateline.

One aspect of the invention provides a method for mitigating ferroelectric memory cell storage node disturbance, comprising biasing a storage node of a non-selected ferroelectric memory cell so as to mitigate charge exchange between the storage node and a bitline during at least a portion of a memory access operation. The non-selected cell storage node may be biased by activating the corresponding plateline, for example, by applying a non-zero voltage signal or pulse to the non-selected plateline during at least a portion of the memory access operation. In one implementation, a single-level pulse is applied to the non-selected plateline during the memory operation. In another implementation, a multi-level voltage signal is employed, such as by applying a first voltage to the non-selected plateline during a first time period, and applying a second voltage to the non-selected plateline during a second time period, wherein the second voltage is greater than the first voltage. In some applications it may be more advantageous to have second voltage lower than the first voltage. The activation of non-selected platelines may be done for each non-selected plateline in an array or a segment thereof, or may be done for only certain non-selected cells.

Another aspect of the invention relates to ferroelectric memory devices that comprise a ferroelectric memory array and a control system that operates to bias a storage node of one or more non-selected ferroelectric memory cells associated with non-selected platelines in the array during at least a portion of a memory access operation. The array comprises a plurality of ferroelectric memory cells arranged in rows and columns, with rows of the memory cells being coupled with a corresponding wordline and a plateline and columns of cells being coupled along corresponding bitlines or pairs of complementary bitlines. The individual array cells comprise a ferroelectric capacitor coupled between a corresponding plateline and a storage node, as well as a cell transistor coupled with the storage node, a corresponding bitline, and a corresponding wordline, where the cell transistor selectively couples the storage node with the corresponding bitline according to a wordline signal on the corresponding wordline when the corresponding array row is selected.

In one implementation, the control system comprises a non-selected plateline pulse system coupled with the array to activate a non-selected plateline coupled with at least one non-selected ferroelectric memory cell during at least a portion of the memory access operation. The non-selected plateline pulse system may be any type of circuit or system that provides a non-zero voltage signal to a non-selected plateline, for example, such as a charge-sharing circuit that provides a non-selected plateline pulse signal to a plateline driver circuit associated with the non-selected ferroelectric memory cell during at least a portion of the memory access operation.

The non-selected plateline pulse system may provide a single-level signal, or a multi-level signal. For example, the charge-sharing circuit may provide a non-selected plateline pulse signal comprising a first voltage during a first time period and a second voltage during a second time period, wherein the second voltage is greater than the first voltage. In one exemplary implementation, the array of ferroelectric memory cells comprises a plurality of plate groups individually comprising a group of ferroelectric memory cells along a plurality of wordlines, the cells in a plate group being coupled with a common plateline, wherein the control system is adapted to bias storage nodes of non-selected ferroelectric memory cells in non-selected plate groups in the ferroelectric memory array during at least a portion of a memory access operation.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1A:
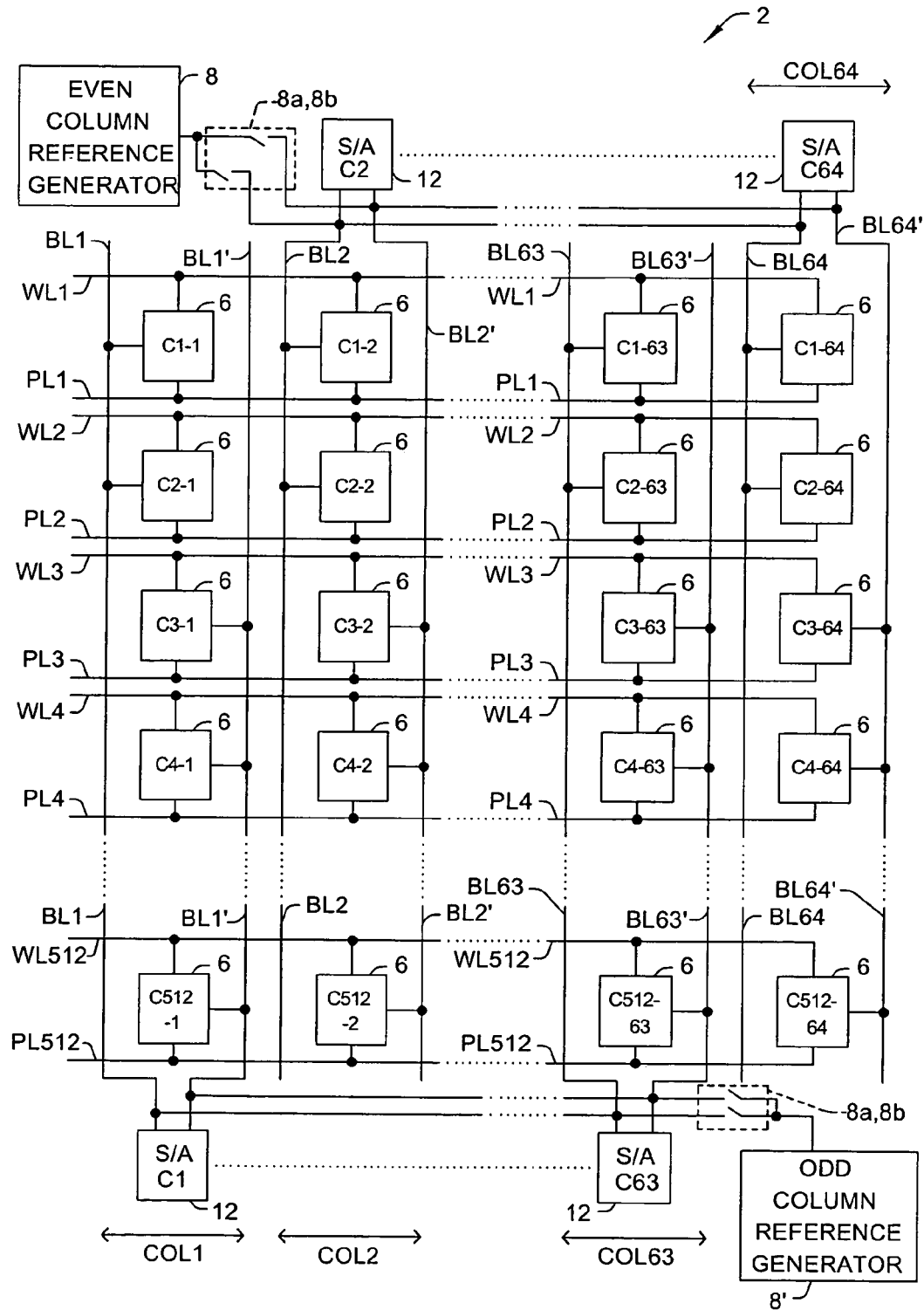
FIG. 1A is a schematic diagram illustrating a portion of a conventional 1T1C folded bitline ferroelectric memory device.

One or more implementations of the present invention will now be described with reference to the attached drawings, wherein like reference numerals are used to refer to like elements throughout. The invention relates to methods and apparatus for biasing non-selected ferroelectric memory cell storage nodes to combat charge transfer through leaking cell transistors during memory read/restore and/or write operations. The invention is illustrated and described below in the context of folded bitline type ferroelectric memory architectures using single transistor, single capacitor (e.g., 1T1C) cells having plate groups in which several rows of cells share a common plateline driver. As used herein, the phrase "non-selected cells" in such shared plateline driver devices, refers to cells that do not share a common plateline driver with cells being accessed for a read/restore or write memory access operation, and non-selected platelines are the platelines of the non-selected cells. Thus, for shared plateline driver implementations, the "non-selected cells" in the appended claims refers to cells of the non-accessed plate groups, and the "non-selected cells" do not include cells sharing a plateline driver with the selected cells. In non-shared plateline driver implementations, the phrase "non-selected cells" refers to cells that are not being accessed in a particular read/restore or write operation, and non-selected platelines are the platelines of the non-selected cells. The invention is not limited to the illustrated implementations, and may alternatively be employed with other cell types (e.g., 2T2C) and/or in other array architectures.

Figure 2A:
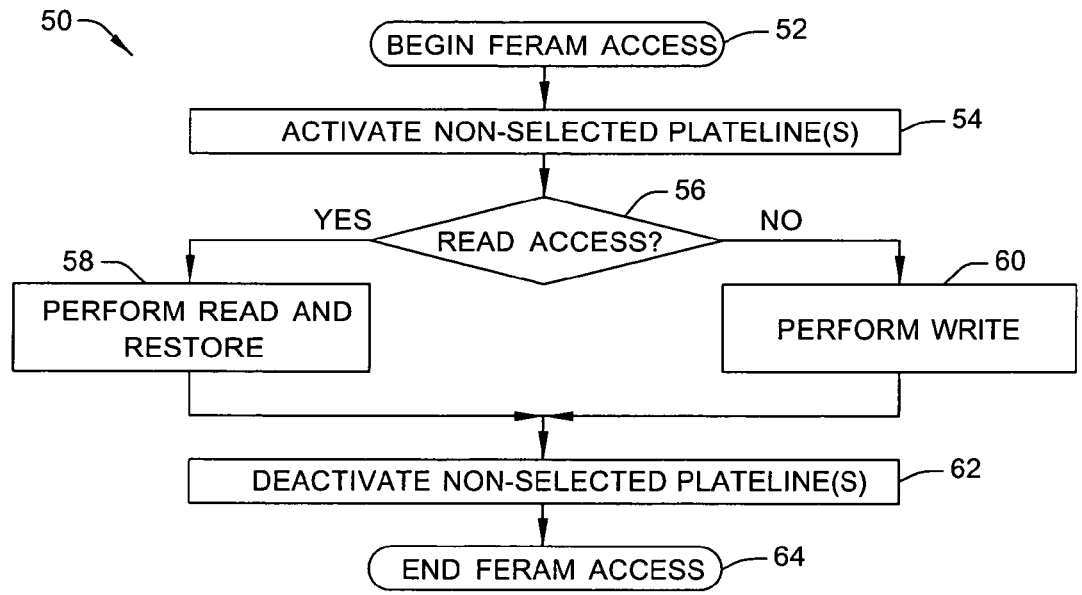
FIG. 2A is a flow diagram illustrating an exemplary method of accessing a ferroelectric memory cell in which one or more non-selected cell storage nodes are biased to mitigate storage node disturbance in accordance with an aspect of the present invention.

Referring initially to FIG. 2A, the methods of the invention provide selective biasing of one or more non-selected ferroelectric memory cell storage nodes so as to combat storage node charge accumulation from array bitlines during memory access operations. The inventors have appreciated that storage node disturbance in the form of acquired charge in conventional ferroelectric devices may have a cumulative effect over a number of access cycles to a ferroelectric memory array or segments or other portions thereof, leading to degradation in signal margin and possibly to depolarization of ferroelectric cell capacitors.

To combat these adverse effects, the present invention provides methods for biasing the storage nodes of non-selected cells during memory access operations, wherein the non-selected storage nodes may be biased by any suitable means. In the implementations illustrated and described below, for example, a single or multi-level voltage pulse signal is applied to activate platelines of one or more non-selected cells during the memory access operations targeting other (e.g., selected) cells. This applied plateline activation signal biases the non-selected cell storage nodes against undesired charge transfer through cell transistor leakage by reverse biasing the cell transistor source node (e.g., the cell storage node) with respect to the transistor gate and body, in order to mitigate or avoid cell capacitor depolarization and degradation in signal margin. However, the invention is not limited to the illustrated implementations, and other methods and apparatus for biasing the non-selected cell storage nodes are contemplated as falling within the scope of the invention and the appended claims.

An exemplary method 50 is illustrated in FIG. 2A for accessing memory cells in a ferroelectric memory device, wherein one or more non-selected platelines are biased against storage node disturbances in accordance with an aspect of the present invention. While the method 50 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated. For instance, the methods of the invention may also be carried out in ferroelectric memory devices that do not employ shared plateline drivers.

Beginning at 52, one or more non-selected platelines are activated at 54 to bias storage nodes associated therewith during all or a portion of a memory access operation. The non-selected platelines may be activated by any suitable means at 54, including but not limited to application of a non-zero voltage signal by a pulse system or circuit associated with non-selected plateline driver circuits in a memory array. As described further below, any suitable non-zero voltage signal may be applied to one or more non-selected platelines at 54 to bias the corresponding storage nodes, and any suitable circuitry or systems may be employed in generating the signals within the scope of the invention. In one example, the biasing of the non-selected cell storage nodes comprises providing electrical charge to the non-selected plateline or platelines during at least a portion of the memory access operation, for instance, using a charge-sharing circuit.

The activation at 54, moreover, may occur at any time during or before a memory access operation 58, 60 within the scope of the invention. For example, a non-zero voltage signal may be applied to one or more non-selected platelines at 54 prior to activation of a selected wordline signal as illustrated in the timing diagrams of FIGS. 4A–4C below. However, other implementations are possible, for example, wherein a non-zero voltage signal is applied to non-selected platelines at 54 concurrently with or following activation of the selected wordline, wherein all such variant implementations are contemplated as falling within the scope of the present invention.

A determination is made at 56 as to whether the desired memory access operation involves reading/restoring data or writing data to a selected target row of cells (e.g., selected cells). If a read/restore is desired (YES at 56), the read and restore is performed at 58 with the one or more non-selected platelines being activated during all or a portion of the memory access operation at 58. If a write operation is desired (NO at 56) a write operation is performed at 60, wherein the non-selected platelines are likewise activated during all or a portion of the write operation at 60. Any suitable read, restore, and/or write operations may be performed at 58 and 60 within the scope of the present invention.

Figure 4A:
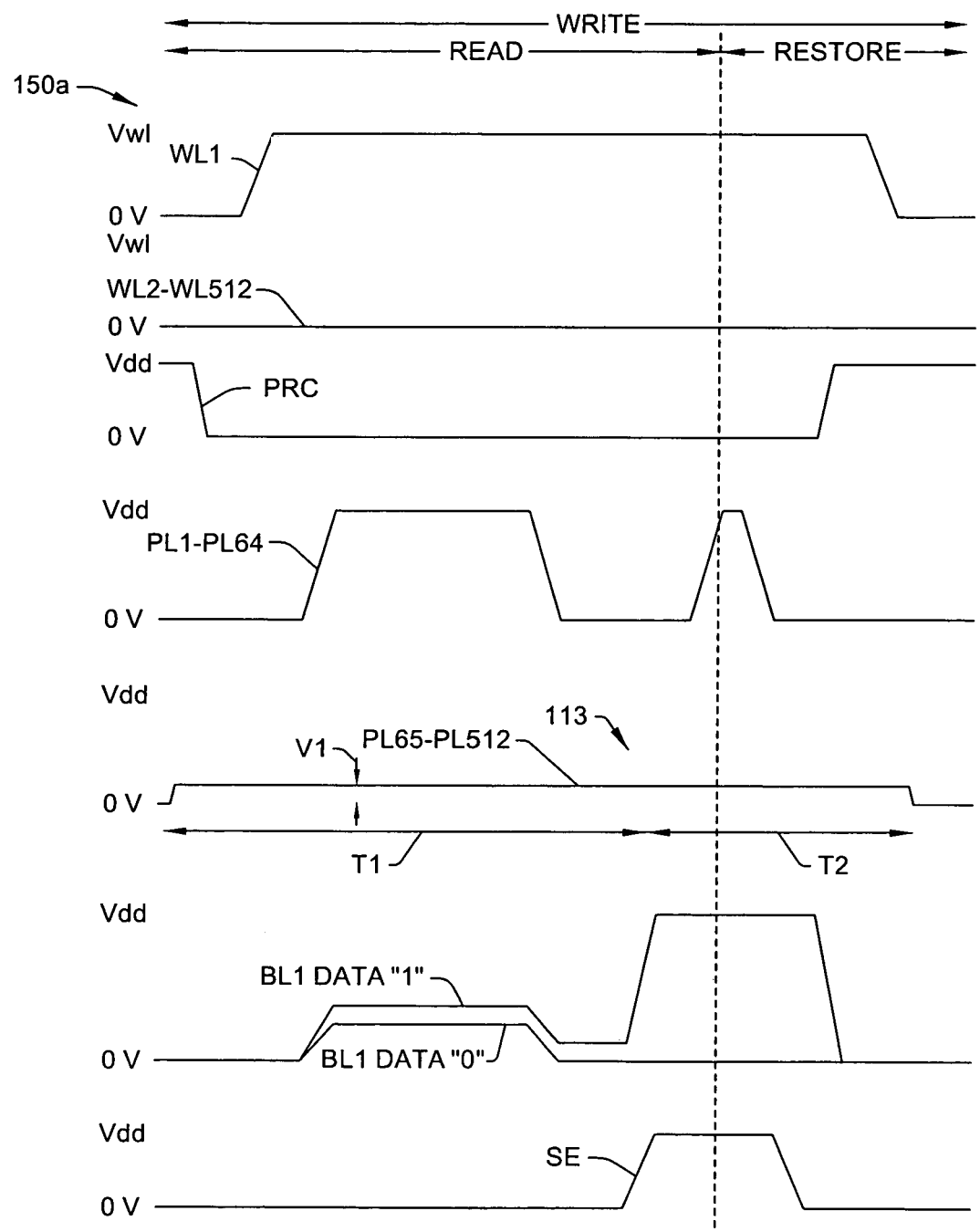
FIGS. 4A–4C are timing diagrams illustrating exemplary non-selected plateline pulse signals and other waveforms during memory access operations in the device of FIGS. 3A–3H.
Figure 4B:
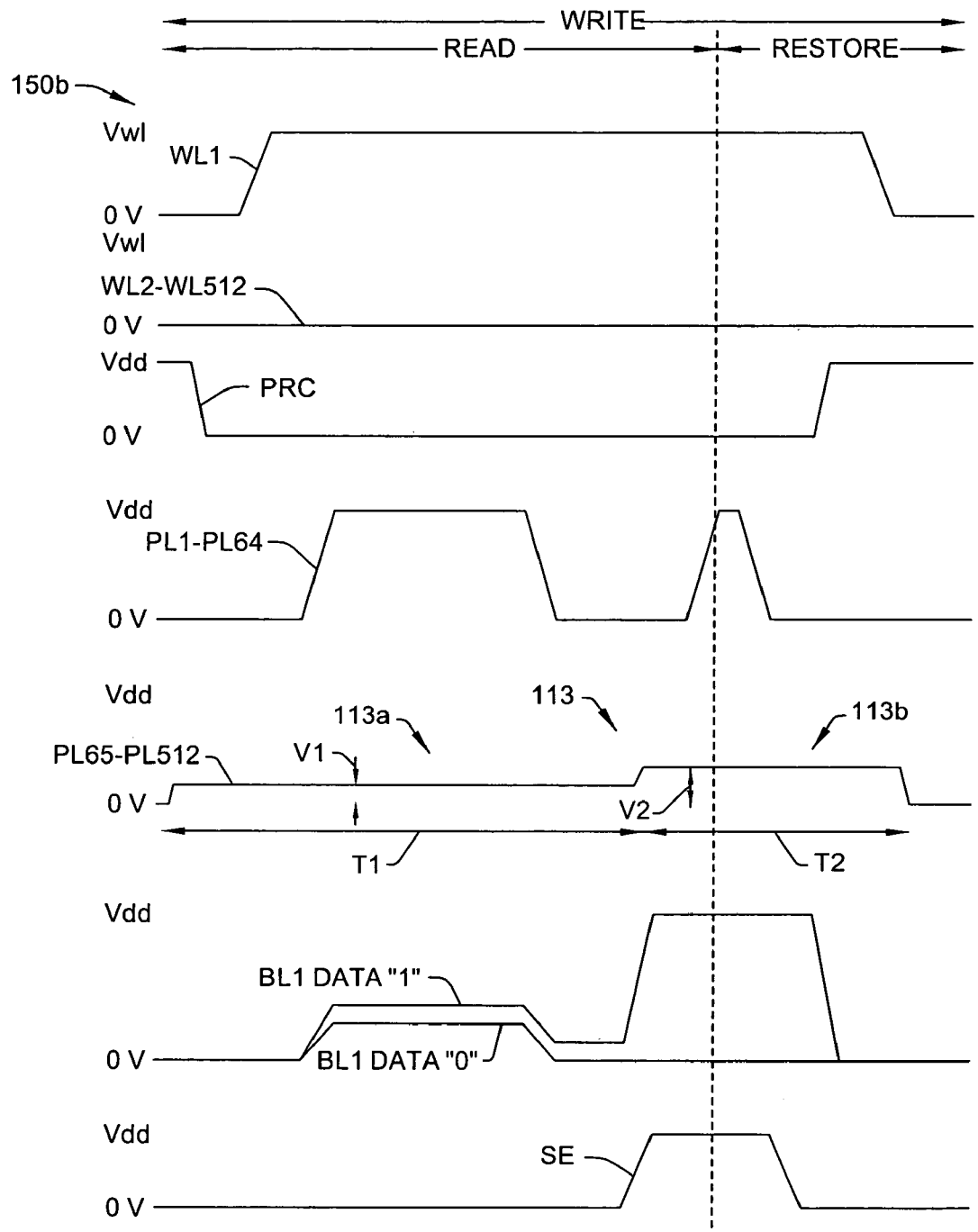
Figure 4C:
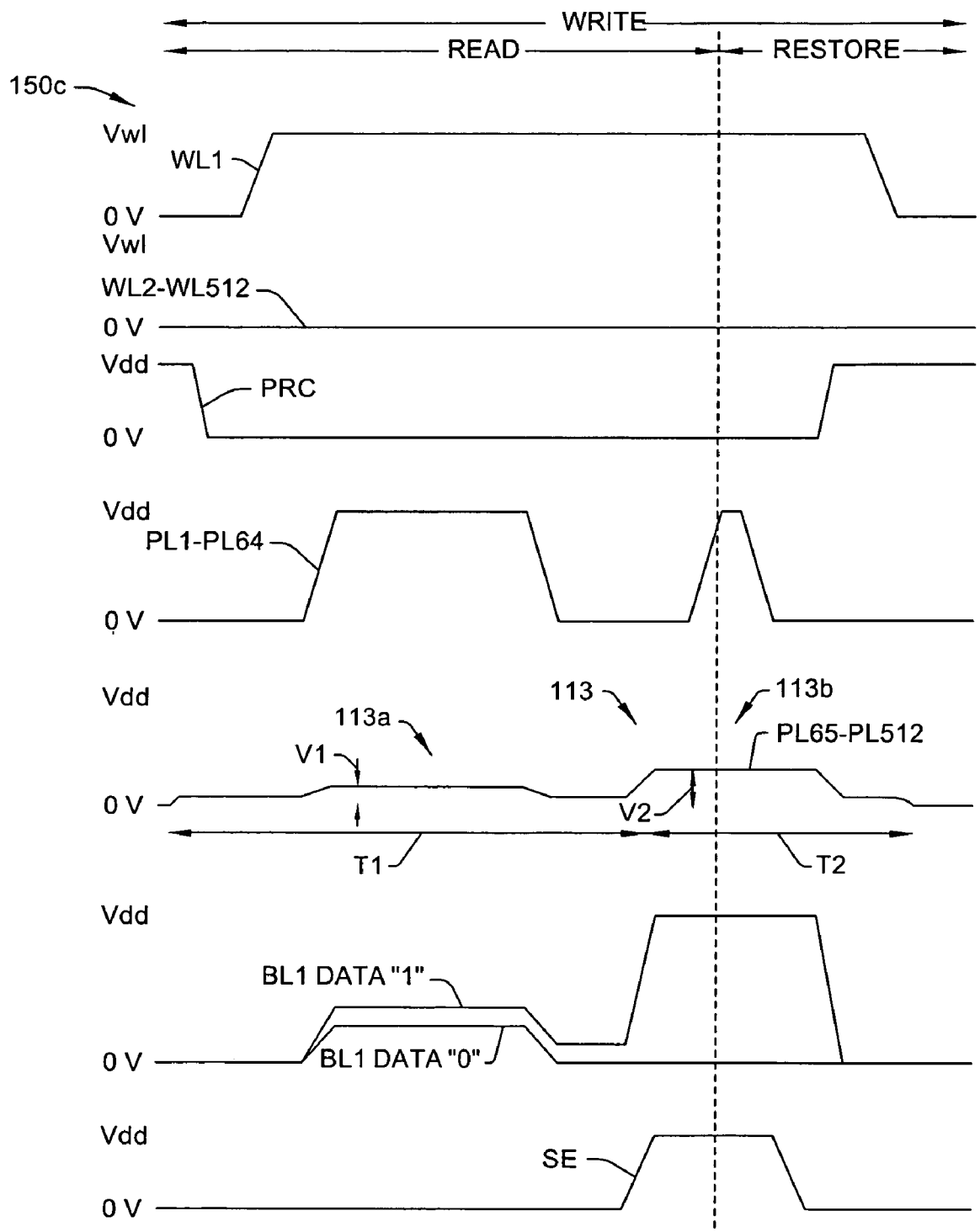

At 62, the non-selected platelines are deactivated and the memory access operation ends at 64. The deactivation of the non-selected platelines at 62 may occur at any time during or after the operation 58, 60 within the scope of the invention. In the examples of FIGS. 4A–4C below, the non-zero voltage signal is discontinued at 62 after the selected wordline is deactivated, thereby bringing the non-selected platelines back to ground (e.g., to the non-activated state voltage of 0 V). Other implementations are possible, for example, wherein the non-zero voltage signal is discontinued at 62 concurrently with or prior to deactivation of the selected wordline, wherein all such variant implementations are contemplated as falling within the scope of the present invention.

Figure 1B:
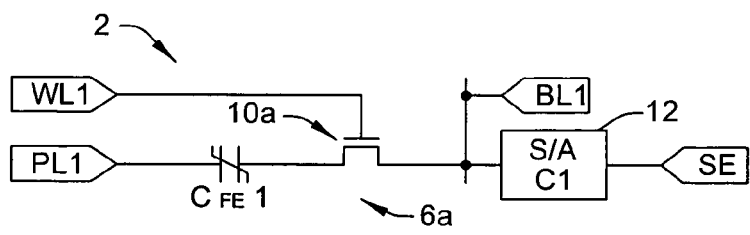
FIG. 1B is a schematic diagram illustrating a 1T1C cell and an associated sense amp in the device of FIG. 1A.
Figure 1C:
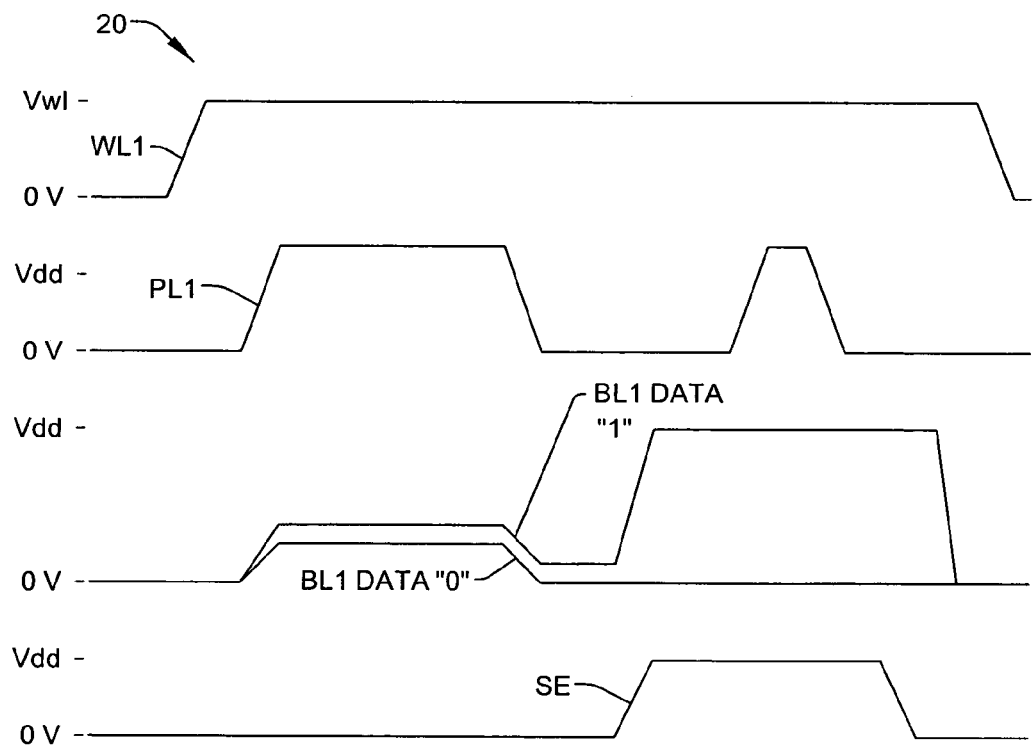
FIG. 1C is a waveform diagram illustrating a conventional read operation in the cell of FIGS. 1A and 1B.

The non-selected plateline activation signal can be of any polarity, duration, form, and/or amplitude within the scope of the invention, wherein several examples are illustrated and described below with respect to FIGS. 4A–4C. Thus, for a preferred implementation in which n-channel (NMOS) transistors are employed as the cell pass gates (e.g., transistor 10a in FIG. 1B above), a positive voltage signal can be applied at 54 to the non-selected platelines via a voltage regulator, charge pump, boot-strap circuit, resistor divider, charge sharing, or other suitable circuit. Alternatively, a negative voltage signal, with respect to the non-activated state voltage, can be employed at 54, for example, where various bias conditions and cell transistors are of complimentary type to what is described in the preferred exemplary implementation. An example would be the case in which the p-channel transistors are used as cell access transistors, wherein the bitlines, platelines, and storage nodes start off at Vdd before the selected wordline is activated by lowering its voltage from a high value to a lower value (e.g., Vss), and wherein the selected plateline for the cell is activated by lowering its voltage from its high value (Vdd) to a lower value (Vss).

For the preferred exemplary implementation which utilizes n-channel (NMOS) cell transistors, biasing the storage nodes to 0.2 to 0.4V can significantly reduce leakage from the bitlines since it results in a reverse bias of the gate to source (storage node) by the same voltage, and increases the transistor threshold voltage. The exemplary storage node reverse bias voltage could be optimized based on several factors, such as transistor leakage, junction leakage, ferroelectric capacitor leakage, operating temperature, supply voltage, etc. Furthermore, the optimized reversed bias values may be different for various time periods in a cycle. In this regard, if the reverse bias voltage is very low, it would not be very effective in preventing leakage from bitline to the storage node. If it is too high, it may cause leakage from the storage node to the bitline and an undesired loss of storage node voltage resulting in degrading of signal margin. For the folded bitline architecture, half of all the bitlines (including complimentary bitlines) in an accessed segment will have 0V on them during restore/write time period. In this case, the storage nodes of the cells with their transistors coupled to the bitlines at 0V will tend to loose charge to the bitlines and this loss will increase if the reverse bias is too high. In this regard, the storage node reverse bias can advantageously be optimized for various periods in a cycle.

Figure 2B:
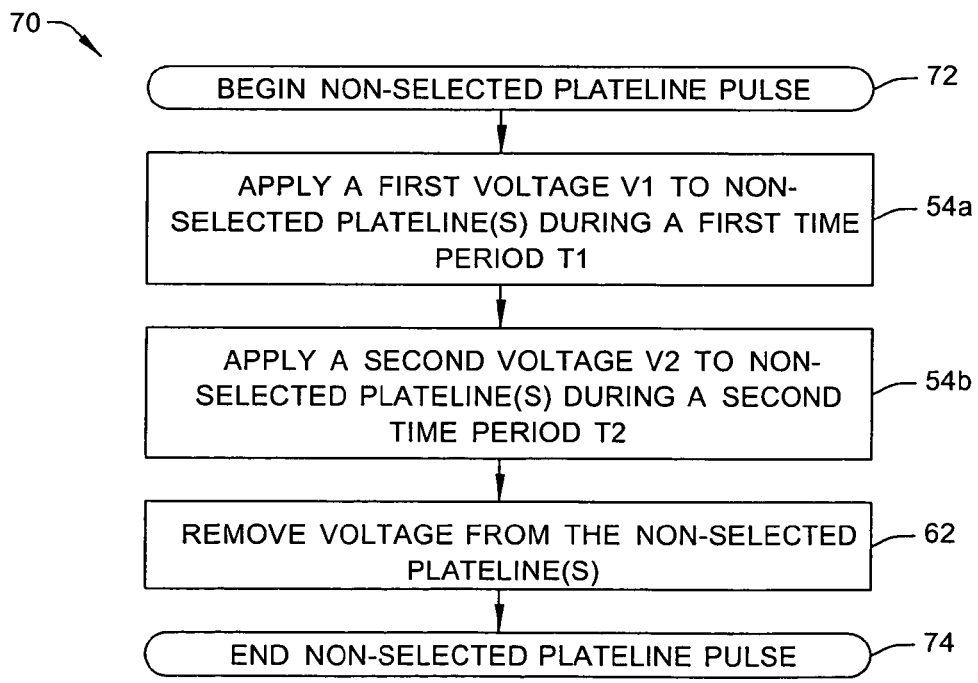
FIG. 2B is a flow diagram illustrating an exemplary method of providing a multi-level plateline pulse to one or more non-selected ferroelectric memory cells according to the invention.

Referring also to FIG. 2B, the non-selected plateline pulse may be a single-level voltage pulse (e.g., FIG. 4A below), or may comprise multiple non-zero voltage levels (e.g., FIGS. 4B and 4C below). FIG. 2B illustrates an exemplary method 70 of applying a multi-level voltage pulse to one or more non-selected ferroelectric memory cell platelines according to the invention, wherein the method 70 may be employed in the method 50 above. Beginning at 72, a first voltage is applied at 54a to the non-selected plateline or platelines during a first time period, wherein at least a portion of the first time period is during the memory access operation. In one example, the first time period (e.g., time period T1 in FIGS. 4B and 4C below) begins prior to activation of the selected wordline, although alternative implementations are possible within the scope of the invention, in which the first time period begins concurrently with or after the selected wordline activation.

A second voltage is applied at 54b to the non-selected plateline during a second time period (e.g., time period T2 in FIGS. 4B and 4C), with at least a portion of the second time period being during the memory access operation 58, 60, wherein the second voltage is greater than the first voltage. Thereafter, the voltage is removed at 62 from the non-selected platelines and the method 70 ends at 74. The inventors have appreciated that application of a second, higher, voltage at 54b may advantageously provide more optimal storage node biasing with respect to fluctuations in the array bitline voltages than is obtained using a single-level pulse.

For example, as illustrated in FIGS. 4B and 4C below, during a read operation using pulse sensing, the target cells are initially selected by activation of the corresponding selected wordline (e.g., turning on the cell transistors of the selected cells). A selected cell plateline signal is then applied (e.g., generally a pulse equal to the supply voltage Vdd in the illustrated examples), to cause charge sharing between the cell capacitor bitline, by which the bitline voltage rises, for example, by about several hundred mV, depending on the data state of the selected cell. The selected plateline is then returned to 0V and a sense amp is activated via a sense amp enable signal SE, thus bringing the bitline voltage to the supply voltage Vdd or to 0V (e.g., Vss), depending on the data state.

Thus, prior to the sense amp being enabled (e.g., during the first time period T1 in the illustrated examples), the bitline voltage is relatively lower than the supply voltage Vdd, wherein a first voltage V1 (e.g., about 0.2 volts in one example) is applied to the non-selected platelines to counteract any leakage through the non-selected cell transistors. During the exemplary second time period T2, a higher second voltage V2 (e.g., about 0.4 V in one example) is employed to counterbalance the possible higher bitline voltage once the sense amp has been enabled (e.g., the bitline voltage may rise to Vdd for a data "1" state), thereby inhibiting undesired charge transfer between the non-selected storage nodes and the associated bitlines through leaky cell transistors.

In the example of FIGS. 4B and 4C below, the second time period T2 begins concurrently with the end of the first time period T1, although alternative implementations are possible in which the second period T2 begins some time after the end of the first time period T1. In general, the second time period may begin at any time during the memory access operation, and may end at any time, by which at least a portion of the first second period is during the memory access operation, wherein all such variant implementations are contemplated as falling within the scope of the invention. Thus, while the exemplary second time period T2 in FIGS. 4B and 4C extends past the time when the selected wordline is deactivated, the second time period may alternatively end (e.g., the second voltage is discontinued) at 62 concurrently with or prior to deactivation of the selected wordline, wherein all such variant implementations are contemplated as falling within the scope of the present invention.

In the exemplary device 102 illustrated and described below in FIGS. 3A–3H, multiple rows of cells are driven by shared plateline drivers, wherein the cell rows sharing a common plateline driver are referred to as a plate group. In this case, the biasing of one or more non-selected cell storage nodes may be done for one or more non-selected plate groups, wherein the (non-selected) shared driver provides a non-selected plateline voltage signal during at least a portion of the memory access operation in accordance with the invention. Furthermore, the methods of the invention, including the exemplary methods 50 and 70 above, can be employed in devices of any array architecture, including but not limited to open and folded bitline configurations, and may be employed in devices having any cell type, such as 1T1C, 2T2C, etc.

In addition, only certain of the non-selected platelines need be activated in any given memory access operation. In other implementations, the non-selected plateline activation may be selectively employed for only certain memory access operations, wherein non-selected platelines may be activated or not in a given memory access operation, and wherein all such variant implementations are contemplated as falling with the scope of the invention and the appended claims. This selectivity in the non-selected storage node biasing may facilitate conservation of power, for example, in situations where pulsing all the non-selected platelines (shared or individually) may be prohibitive with respect to power consumption. In this regard, the ordering of the various acts or events in the illustrated methods 50 and 70 of FIGS. 2A and 2B are exemplary only, and these acts may be performed in any order within the scope of the invention, and one or some of these acts need not be performed for each memory access operation.

Referring now to FIGS. 3A–3H and 4A–4C, another aspect of the invention provides semiconductor devices and non-selected plateline pulse systems therefor to bias a storage node of a non-selected ferroelectric memory cell in a ferroelectric memory array during at least a portion of a memory access operation. FIGS. 3A–3H illustrate an exemplary ferroelectric memory device 102 in accordance with the invention, comprising an array 104 of ferroelectric memory cells 106 (FIG. 3E) arranged in rows and columns, along with a control system or circuit 122 coupled with the array 104 to generate wordline and plateline signals according to decoded address information or signals for read, restore, and write operations. Various exemplary waveforms and signals are illustrated in the timing diagrams of FIGS. 4A–4C in the device 102.

Figure 3A:
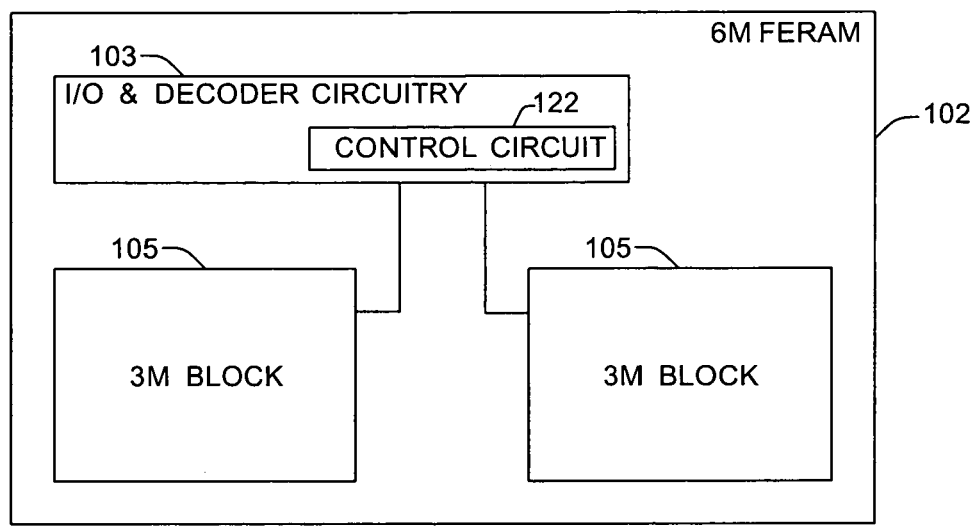
FIGS. 3A–3H are schematic diagrams illustrating an exemplary ferroelectric memory device having a non-selected plateline pulse system in accordance with another aspect of the invention.
Figure 3B:
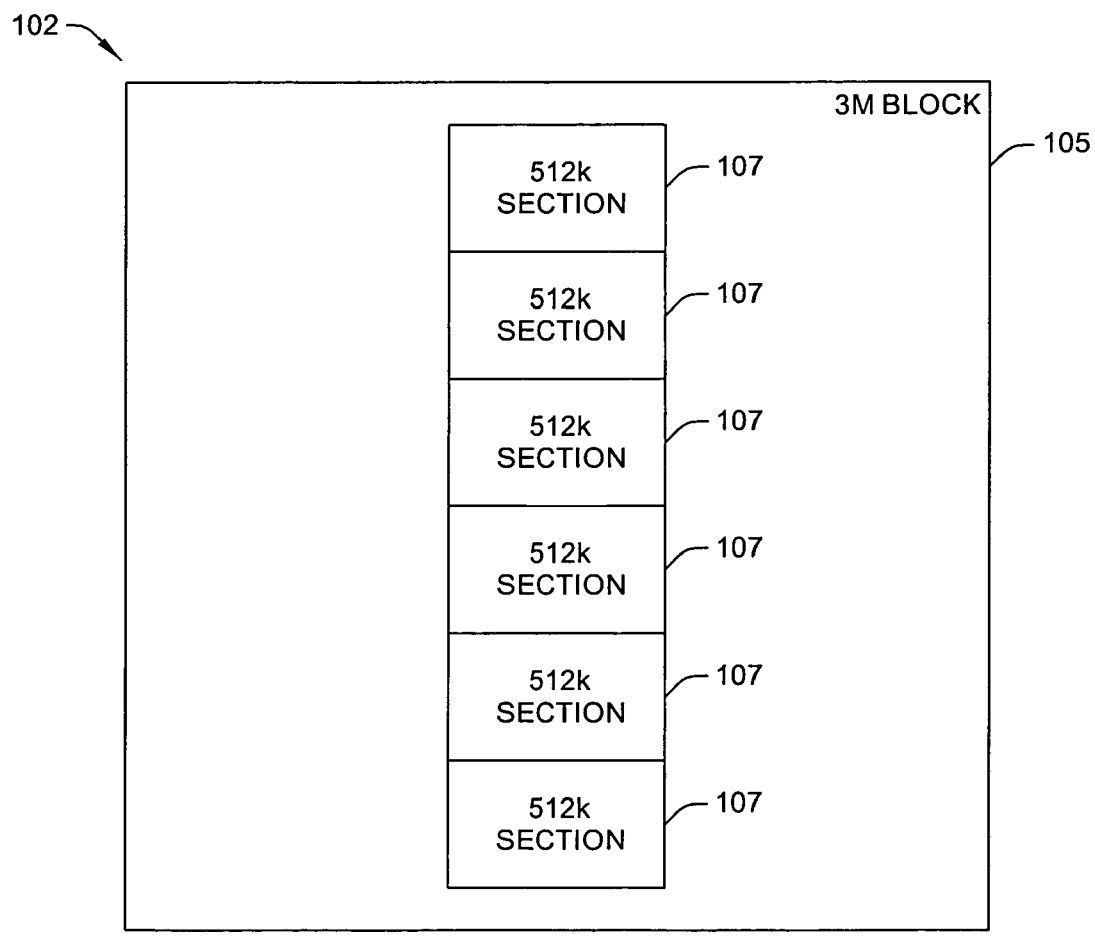
Figure 3C:
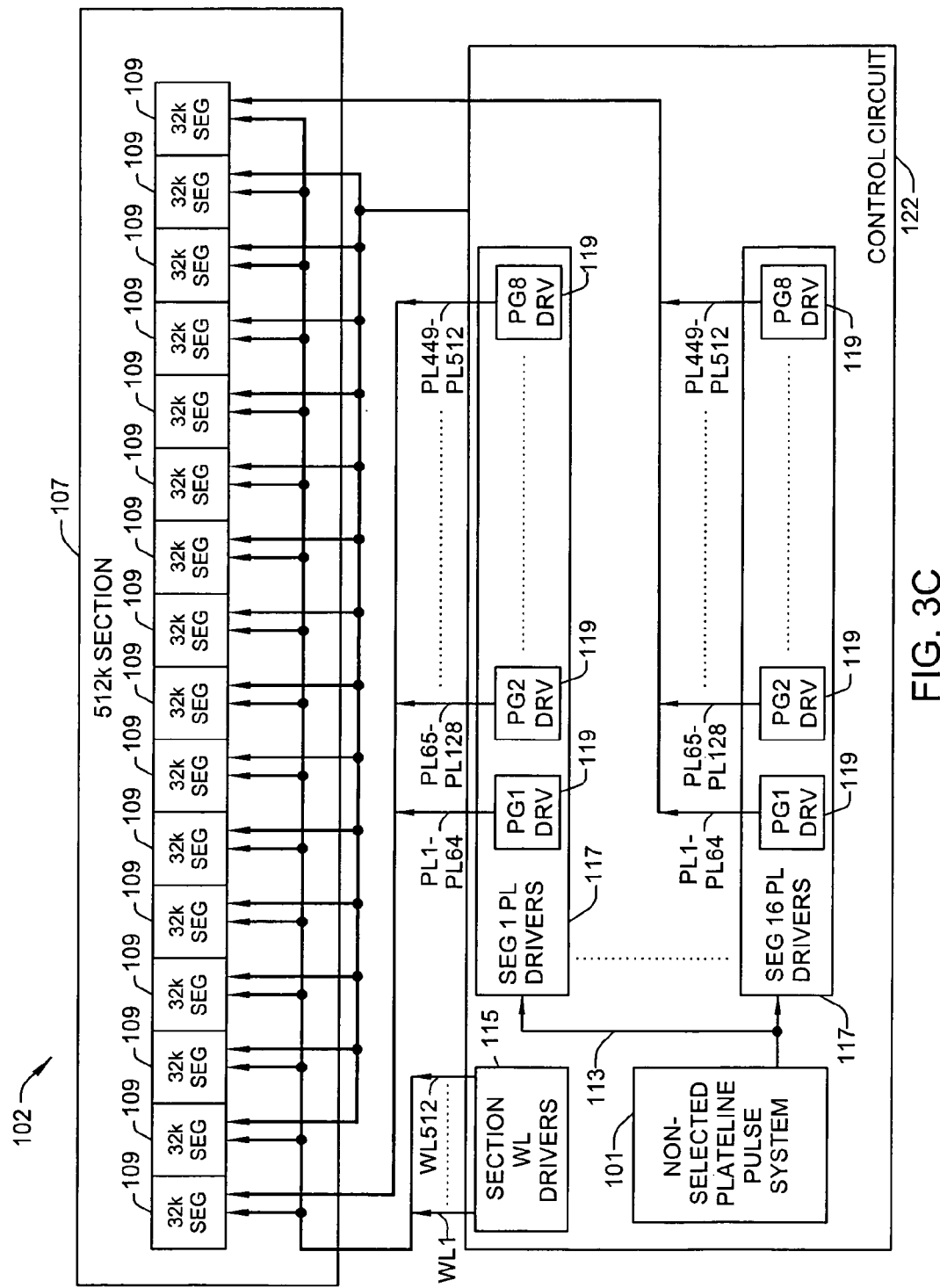
Figure 3D:
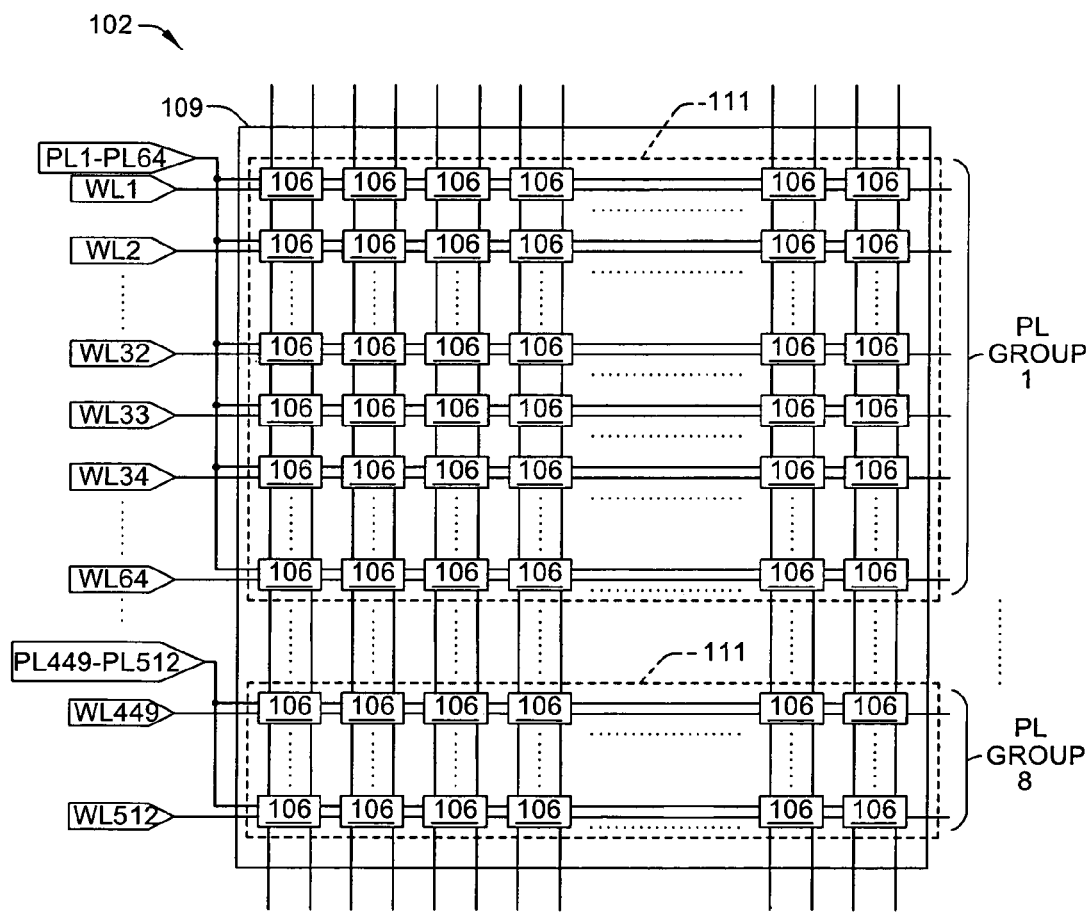

As shown in FIG. 3A, the exemplary device 102 is a 6M ferroelectric memory, including I/O and decoder circuitry 103 that comprises the control circuit 122, as well as two 3M memory blocks 105. The memory blocks 105 are further divided into 6 sections of 512 k each, as shown in FIGS. 3B and 3C. Each section 107 has a corresponding wordline driver circuit or system 115 (FIGS. 3C and 3F) and comprises 16 segments 109 of 32 k each, wherein one such segment 109 is further illustrated in FIGS. 3D and 3E. As shown in FIGS. 3D and 3F, moreover, the memory cells 106 of the exemplary segments 109 are partitioned into plate groups 111 of 64 rows per plate group, wherein each plate group has a common plate line driver coupled to all the platelines in a group.

In the exemplary device 102, the wordlines, extend across (e.g., are shared among) multiple segments 109 within a given section 107, wherein the wordline drivers 115 for the individual sections 107 may comprise part of the control circuit 122. The exemplary device 102, moreover, provides plateline driver circuits or systems 117 that are associated with individual 32k segments 109, as illustrated in FIG. 3C. The plateline driver circuit 117 for each segment 109 comprises a plurality of plateline drivers 119 (e.g., PG1 DRV, PG2 DRV, . . . , PG8 DRV in FIG. 3C) which may also form a part of the control circuitry 122, and which are individually associated with corresponding memory segments 109, wherein a given plateline driver 119 is shared within a segment among the rows of cells that form a plate group. Normally, one or more cells from only one selected segment are accessed a time. But in some circuits the cells from more than one selected segments may be accessed simultaneously. However, typically, none of the plateline drivers associated with unselected segments is activated during an access because the bitlines of the unselected segments are held at 0V and do not contribute to storage node disturbance.

In accordance with the present invention, the device 102 also comprises a non-selected plateline pulse system or circuit 101 (FIG. 3C) that operates to bias storage nodes of one or more non-selected ferroelectric memory cells 106 during memory access operations (e.g., read, restore, write operations, etc.). In the illustrated device, 102, the exemplary non-selected plateline pulse system 101 biases the non-selected storage nodes by providing a non-selected plateline activation signal 113 (e.g., such as a non-zero single or multi-level voltage pulse 113) to the driver systems 117. FIG. 3H illustrates further details of an exemplary non-selected plateline pulse system 101, implemented as a charge-sharing circuit to generate a multi-level activation pulse signal 113, although any suitable circuit or system may be employed which operates to bias the non-selected storage node within the scope of the invention, including but not limited to voltage regulators, charge pumps, boot-strap circuits, resistor dividers, charge sharing systems, or other suitable circuit.

Figure 3E:
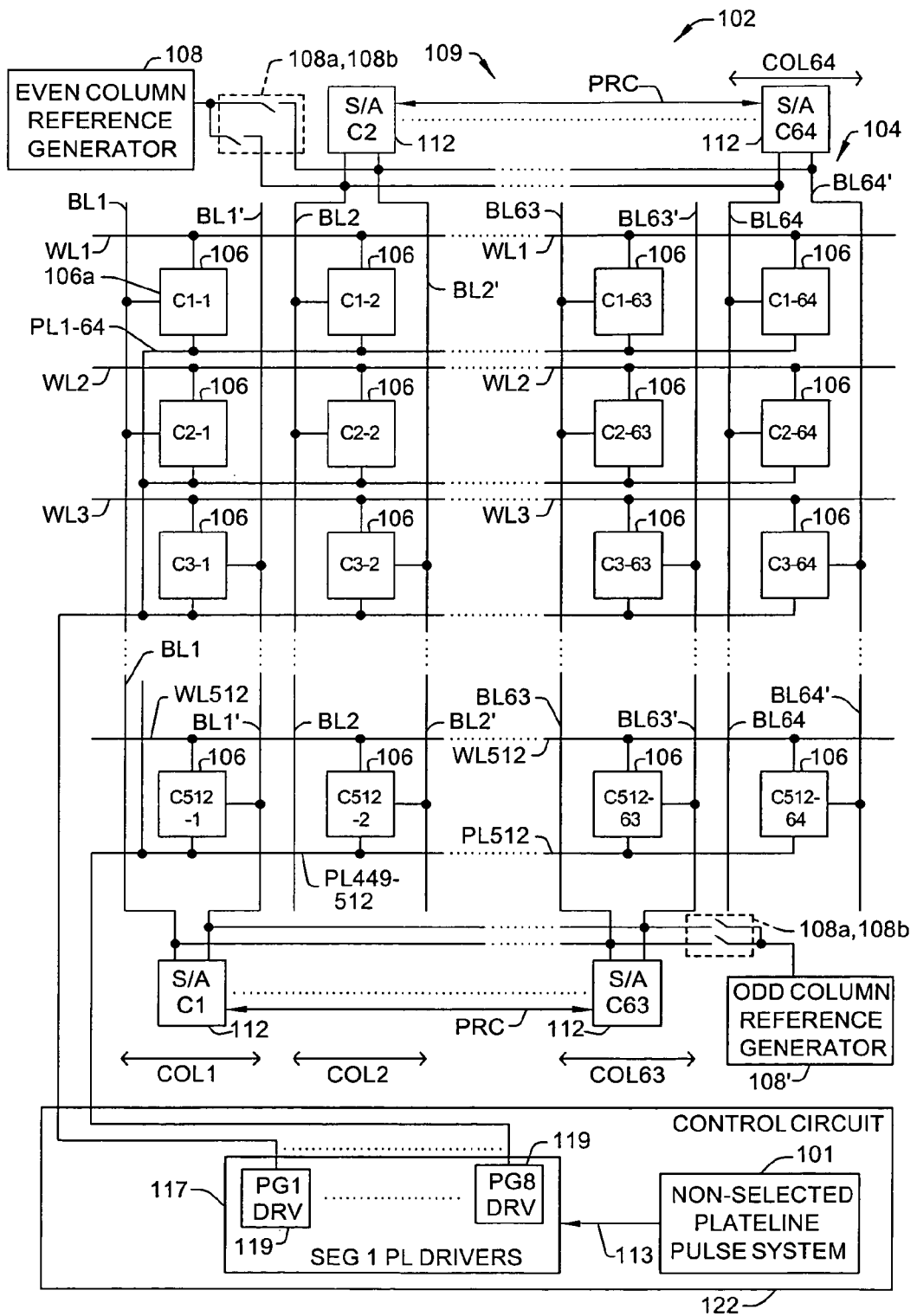
Figure 3F:
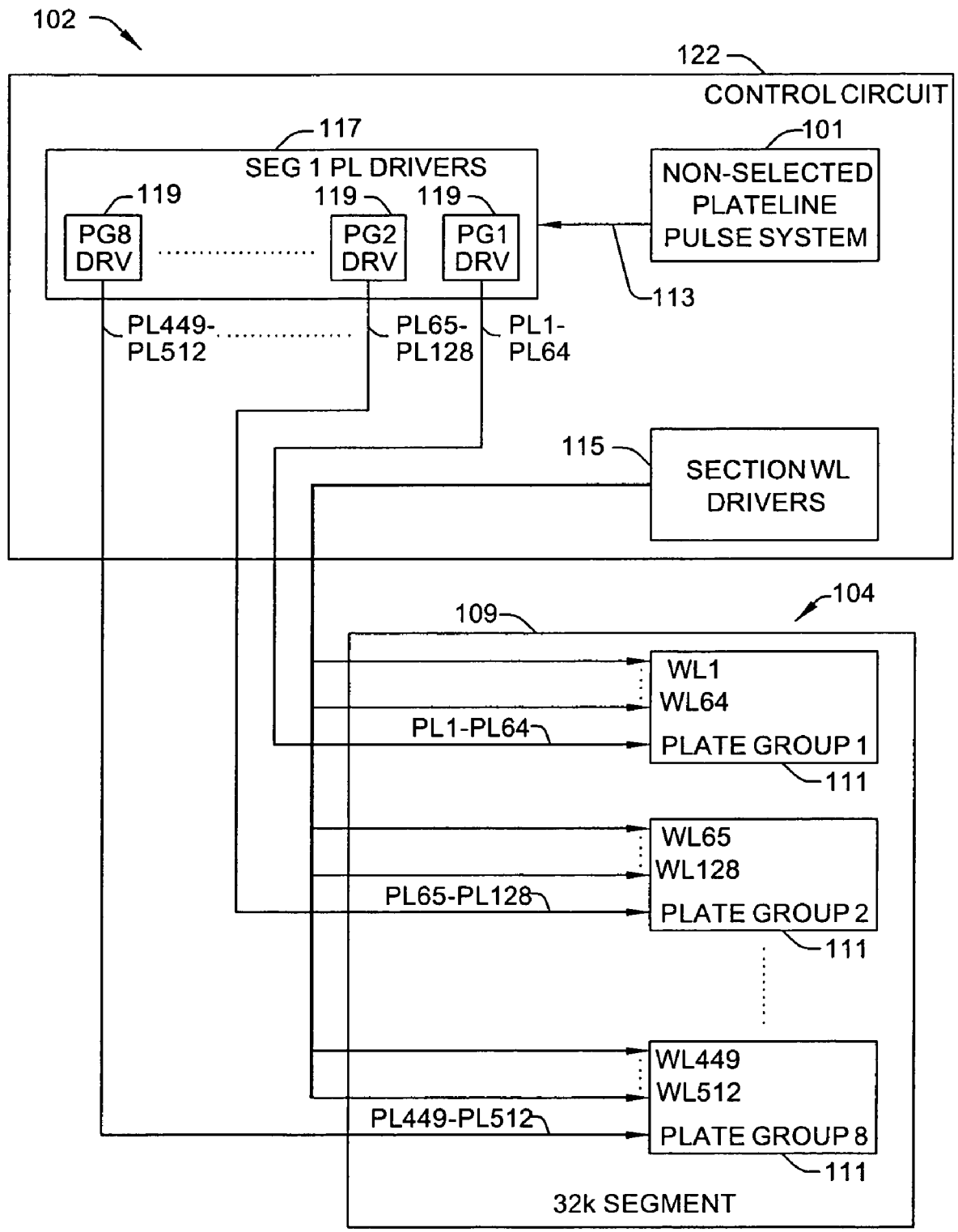
Figure 3G:
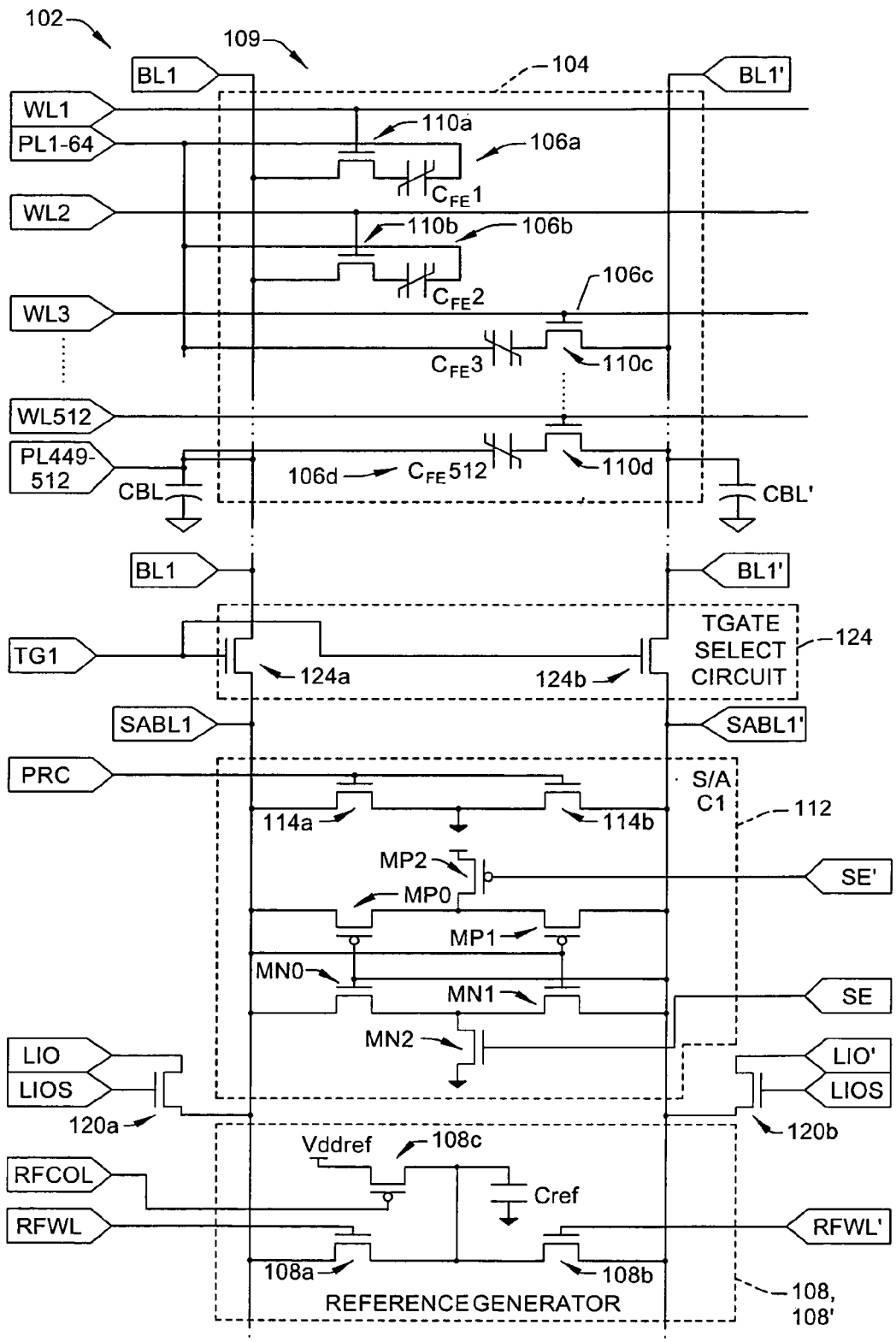
Figure 3H:
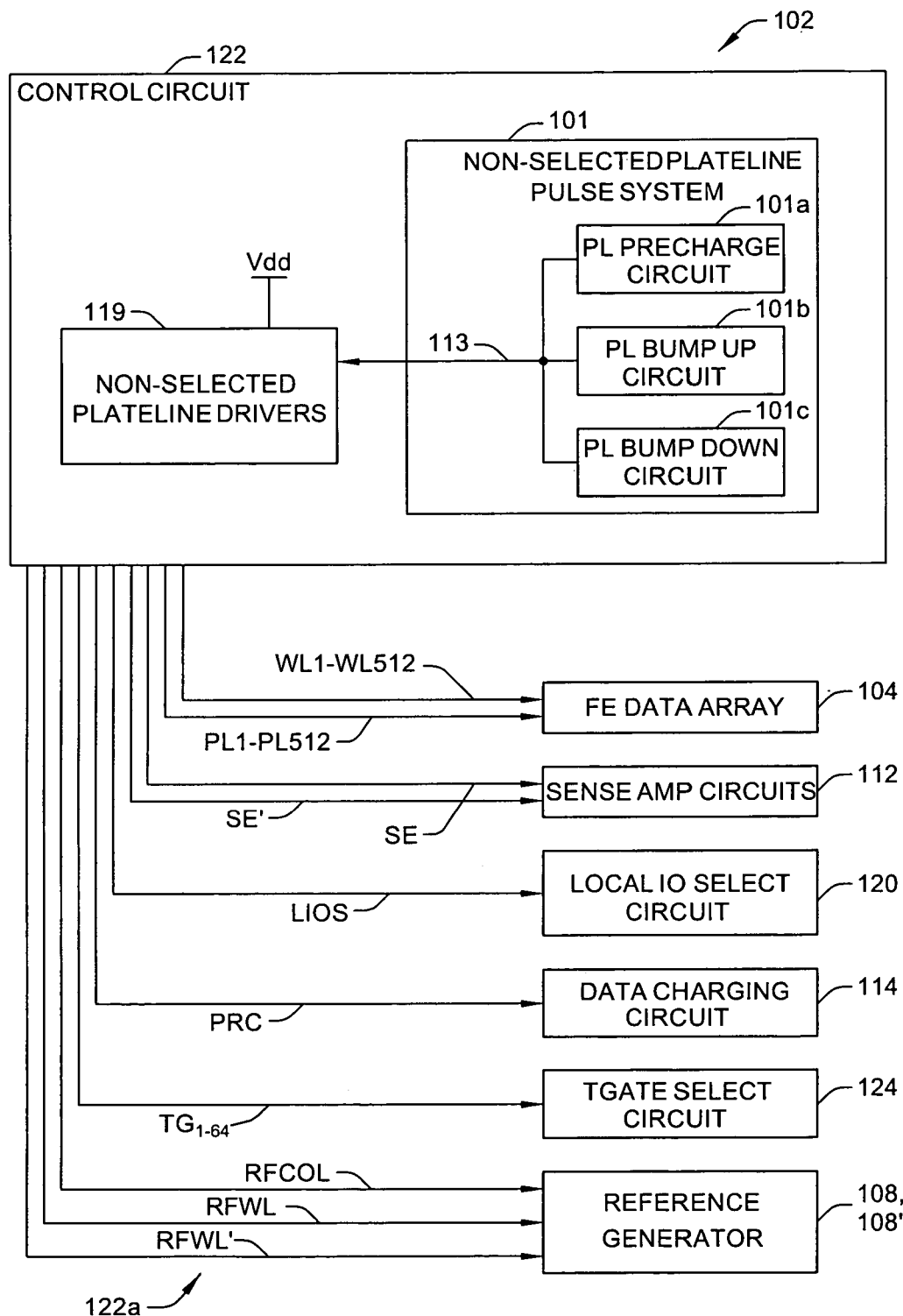

FIG. 3E further illustrates one exemplary memory segment 109 in the device 102, FIGS. 3F and 3H illustrate further details of the exemplary non-selected plateline pulse system 101 with respect to the exemplary segment 109, and FIG. 3G illustrates an exemplary column in the segment 109, wherein FIG. 3H also illustrates the exemplary control circuit 122 and various control signals 122a generated thereby. FIGS. 4A–4C provide timing diagrams 150a–150c, respectively, illustrating operation of several possible implementations of the exemplary ferroelectric memory device 102 during read, restore, and write memory access operations in accordance with the invention.

As illustrated in FIG. 3E, the exemplary device 102 comprises a folded bitline ferroelectric memory array 104, reference generators 108 and 108' coupled with the bitlines BL1/BL1' through BL64/BL64' along columns of the array 104 via switches 108a and 108b, and sense amps 112. TGATE select circuits 124 are provided for each column to selectively couple the sense amps 112 with bitlines of the illustrated segment 109, thus allowing sharing of the sense amps 112 across multiple array segments 109. The illustrated segment 109 comprises 1T1C ferroelectric data memory cells 106 organized in rows along wordlines WL1–WL512 and columns along complementary data bitline pairs BL/BL' in a folded bitline configuration, wherein the wordlines WL1–WL512, shared plateline signals PL1–PL512, and other control and timing signals 122a are provided by a control circuit 122 (FIG. 3H).

In the exemplary array segment 109, the memory cells along WL1 and WL2 (as well as those along WL5, WL6, WL9, WL10, . . . , WL509, WL510) are coupled with bitlines BL1–BL64, whereas cells along WL3 and WL4 (as well as those along WL7, WL8, WL11, WL12, . . . , WL511, WL512) are coupled with the complementary bitlines BL1'–BL64'. In reading the first data word along the wordline WL1, the cells C1-1 through C1-64 are connected to the sense amps via the bitlines BL1, BL2 . . . , BL63, and BL64 while the complementary reference bitlines BL1', BL2' . . . , BL63', and BL64' are connected to the reference voltage generators 108, 108'. The wordline numbering of the device 102 is exemplary only, wherein other wordline/row organizations are possible within the scope of the invention.

FIG. 3G illustrates further details of the first column of the segment 109 along the data bitline pair BL1/BL1', in which several exemplary ferroelectric memory data cells 106a–106d are illustrated comprising ferroelectric capacitors $C_{FE}1$–$C_{FE}512$ and n-channel (NMOS) cell access transistors 110a–110d configured in the first column along the bitlines BL1 and BL1', wherein the exemplary segments 109 include 64 such columns. The ferroelectric cell capacitors $C_{FE}$ may be fabricated from any appropriate ferroelectric material in a wafer, such as Pb(Zr, Ti)O3 (PZT), (Ba, Sr)TiO3 (BST), SrTiO3 (STO), SrBi2Ta2O9 (SBT), BaTiO3 (BTO), (Bil-xLax) 4Ti3O12 (BLT), or other ferroelectric material fabricated between two conductive electrodes to form a ferroelectric capacitor $C_{FE}$.

The cells 106a–106d of FIG. 3G and the contents thereof are accessed during read, restore, and write operations via the array bitlines BL1 and BL1' through activation of the wordline and plateline signals WL1–WL512 and PL1–PL512, respectively, by the control circuit 122 of FIG. 3H. The ferroelectric capacitor $C_{FE}1$ of the first row is coupled with the bitline BL1 via the first wordline signal WL1 and an access transistor or pass gate 110a, and the cell capacitor $C_{FE}1$ is accessed via activation of a cell plateline signal (e.g., pulse) PL1 from the control system 122. The plateline PL1 and other platelines of the device 102 may be alternatively driven with a supply voltage pulse (e.g., Vdd) for reading the first row of cells 106a, or with a non-selected plateline pulse 113 where the first row is not selected for a particular memory access operation in accordance with the present invention.

To read the first row of data, the array bitlines BL1/BL1' are precharged to ground (e.g., Vss or 0 V) via a PRC signal from the control system 122 using transistors 114a and 114b in the shared sense amp circuit 112, and the selected plateline (e.g., PL1 for reading the first row) is brought to Vdd or some other positive voltage, thereby creating a voltage across the cell capacitor $C_{FE}1$. In other implementations, the plateline signal can be activated by any signal on the plateline PL1 or combination of plateline and bitline control signals by which a voltage is created across the cell capacitor $C_{FE}1$ (e.g., the plateline voltage is different than the bitline voltage) to access (e.g., read) the data thereof. Thereafter, the selected plateline is deactivated before enabling the sense amp 112 by bringing the plateline voltage PL1 back to Vss. The plateline pulse PL1 thus causes charge to be transferred from the cell capacitor $C_{FE}1$ during a read operation, whereby a voltage is established on the bitline BL1 that is representative of the data stored in the cell 106a.

Also during the read operation, a reference voltage is supplied to the complementary bitline BL1' via reference generator 108' by charging a reference capacitor Cref (FIG. 3G) to a voltage Vddref according to a signal RFCOL from the control system 122. The charged reference capacitor Cref is then selectively coupled to one of the complementary bitlines BL1 or BL1' (e.g., to BL1' in the case where the first row is accessed) according to control signals RFWL and RFWL', respectively, from the control system 122.

The sense amp 112 is then enabled via a signal SE to sense the differential voltage on the bitline pair BL1/BL1' to ascertain the data state stored in the target cell 106a. The data may then be transferred to I/O circuitry via local I/O data lines LIO/LIO' according to a signal LIOS to turn on I/O access transistors 120a and 120b. During read and other memory access operations, the sense amp 112 and the sense amp bitlines SABL/SABL' thereof are coupled with the array bitlines BL1/BL1' via transistors 124a and 124b in a TGATE select circuit 124 according to a signal TG1 from the control system 122. The exemplary sense amp 112 of FIG. 3G comprises NMOS transistors MN0, MN1, and MN2 as well as PMOS transistors MP0, MP1, and MP2. The sense amp 112 is enabled using sense amp enable signals SE and SE' provided by the control circuit 122 to sense amp transistors MN2 and MP2, respectively.

During such a memory access, the present invention is employed to bias the storage node of one or more non-accessed (e.g., non-selected) ferroelectric memory cells. In this manner, the adverse effects of storage node disturbances can be avoided or mitigated, wherein the applied bias can counteract undesired charge exchange with the bitlines BL1/BL1' caused by cell transistor leakage while the bitlines are at a non-zero positive voltage. For example, in the exemplary device 102, the cells along the first 64 rows are pulsed with identical plateline signals along the shared plateline PL1–PL64 when the first data row is accessed (e.g., in reading the first row along WL1). In this example, the non-selected plateline pulse system 101 provides a pulse 113 to the non-selected platelines PL65–PL512 in the selected segment 109. With respect to row 512 in FIG. 3G, for example, this pulse 113 serves to raise the voltage at the storage node between the cell capacitor $C_{FE}512$ and the cell transistor 110d in the cell 106d of row 512. Thus, even if the transistor 110d allows current flow between the bitline BL1' and the storage node when the reference voltage is applied thereto, such current flow will be reduced or inhibited by the bias to the storage node. The same is true of the non-selected cells coupled to the bitline BL along which the cell data is being read.

FIG. 4A illustrates a timing or waveform diagram 150a showing exemplary read and restore operations targeting cells along the first row of the segment 109 (e.g., along WL1). A write operation in the exemplary device is similar to the illustrated restore operation. The selected wordline WL1 is activated and thereafter a plateline pulse (e.g., Vdd) is applied to the selected plateline PL1 (e.g., together with PL2–PL64 in the illustrated device 102).

To sense the data of the cell 106a during the read operation, a reference voltage is applied to the complementary bitline BL1', for example, using reference generator 108' and switch 108a in FIG. 3G. This creates a differential voltage at the input terminals of the sense amp 112 (e.g., sense amp bitlines SABL1/SABL1'), the polarity of which indicates the data stored in the target data cell 106a. In the pulse sensing example of FIG. 4A, the selected plateline PL1 is then brought low (e.g., deactivated) and the sense amp is thereafter enabled via the SE signal to begin sensing operation. Alternatively, step sensing may be employed, wherein the sense amp enable signal SE is brought high prior to deactivating the plateline PL1 signal (e.g., prior to bringing PL1 low).

Once the sense amp enable signal SE is raised, the sense amp 112 clamps the bitlines BL1/BL1' to Vdd and 0 V, depending on the cell data state, and thereafter the local I/O signal LIOS can be asserted to provide the sensed data to I/O circuitry (not shown). Following a read operation, the data is written back (e.g., restored) into the target cell 106, wherein another pulse is applied to the selected cell plateline PL1 while the sense amp 112 has latched the data (e.g., while one bitline is at Vss and the other is at Vdd, depending on the data).

In a write operation the local I/O signal LIOS latches the data into the sense amp 112 and subsequently impresses the data over the bitlines BL1/BL1' or SABL1/SABL1', or alternatively, the local I/O signal LIOS directly impresses the data onto the bitlines BL1/BL1' or SABL1/SABL1' during the write or restore period. Once the data has been restored or written to the cell 106a with PL1 at Vss (also at Vss are PL2–PL64 in the shared plateline driver configuration of the device 102) the control circuit 122 brings the wordline WL1 low, and activates the PRC signal to precharge the bitlines to Vss.

In the example of FIG. 4A, a single-level positive voltage pulse 113 is applied to one, some, or all of the non-selected platelines PL65–PL512 during the read/restore or write operation accessing the cells along the first row. As shown in FIG. 4A, when accessing the first row, the selected plate group (e.g., PLATE GROUP 1 in FIG. 3F) is provided with the illustrated plateline pulse along PL1–PL64 at the supply voltage level Vdd. During such a memory access operation, the non-selected plateline pulse system 101 provides a pulse 113 to the non-selected platelines PL65–PL512 (e.g., PLATE GROUP 2 through PLATE GROUP 8 in FIG. 3F). As illustrated in FIG. 4A, the exemplary single-level pulse 113 is applied during first and second time periods T1 and T2, having an amplitude V1 of about 0.2 V. Other single-level pulse implementations are possible within the scope of the invention, wherein the pulse 113 may have any suitable amplitude V1 and any duration during all or a portion of the memory access operation.

Referring also to FIG. 4B, the non-selected plateline pulse 113 may be a multi-level voltage signal to bias the non-selected storage nodes to more effectively counteract the storage node disturbance effect of leaky cell transistors 110. In the timing diagram 150b of FIG. 4B, a two-level pulse 113 is provided by the non-selected plateline pulse system 101 (e.g., to the non-selected platelines PL65–PL512) during a read/restore or write operation targeting the cells along the first array row. In this case, the system 101 provides a pulse 113 having a first portion 113a with a first voltage level V1 during a first time period T1, and a second portion 113b of a second (e.g., higher) voltage level V2 during a second time period T2. In some applications the voltage level V2 may be lower than the voltage level V1. In the example of FIG. 4B, the first time period T1 begins prior to activation of the selected wordline WL1, although alternative implementations are possible within the scope of the invention, in which at least a portion of the first time period T1 is during a memory access operation, wherein T1 may begin concurrently with or after the activation of the selected wordline WL1.

The second voltage V2 is then applied during T2, at least a portion of T2 being during the memory access operation, where V2 is greater than V1, after which the voltage pulse 113 is discontinued, wherein the non-selected platelines PL65–PL512 return to ground (e.g., 0V). In this example, the first time period T1 and the second time period T2 are sequential, although other implementations are possible wherein T2 begins some time after T1 ends. The exemplary second time period T2 begins roughly when the sense amp is enabled (e.g., generally concurrent with activation of the signal SE), whereby the amount of applied storage node bias is increased to counteract the increased bitline voltage (e.g., for data "1" being read on the bitline BL1). However, the start of T2 (e.g., and the end of T1) may be at any time during the memory access operation within the scope of the invention. Also, while the illustrated second time period T2 extends beyond the deactivation of the selected wordline (WL1 in this example), the second time period T2 may alternatively end concurrently with or prior to deactivation of the selected wordline WL1, wherein all such variant implementations are contemplated as falling within the scope of the present invention.

It is noted that the exemplary device 102 includes n-channel (NMOS) cell transistors 110, wherein the first and second voltages V1 and V2, respectively, are both positive. Alternatively, a negative pulse 113 (e.g., single or multi-level) can be provided within the scope of the invention (for example, where the cell transistors 110 are p-channel (PMOS) and various bias conditions are complementary to those described for an n-channel cell transistor), with V2 being more negative than V1.

Referring to FIGS. 3H and 4C, other multi-level implementations are contemplated within the scope of the invention, for example, wherein the non-selected plateline pulses system 101 provides any number of levels in the pulse 113. As one example, a charge-sharing circuit or system may be employed in constructing the non-selected plateline pulse system 101, wherein an ideal two-level pulse 113 as in FIG. 4B actually appears as several levels, as in the timing diagram 150c of FIG. 4C, due to parasitic capacitive coupling between bitlines and platelines. The parasitic coupling can be significant, for example, if the platelines and bitlines run in adjacent metal layers in a particular device. The non-selected plateline pulse system 101 may be any form of circuitry within the scope of the invention, including but not limited to a voltage regulator, charge pump, boot-strap circuit, resistor divider, charge sharing, or other suitable circuit.

As illustrated in FIGS. 3C, 3F, and 3H, the non-selected plateline pulse system 101 is coupled to provide the signal 113 to the driver systems 117 and the individual plateline drivers 119 thereof for a corresponding segment, wherein a single system 101 or multiple pulse systems 101 may be provided for each plateline driver 119, each segment 109, each section 107, each block 105 or all the blocks. In the illustrated implementation, the signal 113 and a supply voltage Vdd are provided to the drivers 119. The drivers 119 include switching and timing circuitry (not shown) for selectively providing a selected plateline pulse (e.g., at Vdd) when the corresponding plate group is selected for a memory access operation, or for activating one or more non-selected platelines according to the signal 113 when the corresponding plate group is not being accessed (e.g., non-selected).

FIG. 3H illustrates further details of one possible implementation of the non-selected plateline pulse system 101, which comprises a charge-sharing circuit including a plateline precharge circuit 101a, a plateline bump up circuit 101b, and a plateline bump down circuit 101c, which cooperatively generate the non-selected plateline pulse signal 113 in FIG. 4C. The exemplary system 101 generally provides the signal 113 having two levels V1 and V2 during the time periods T1 and T2, respectively, wherein the charge-sharing nature of the circuits 101a–101c causes the non-selected plateline voltage to fluctuate to different intermediate levels based on other signals changing in the array 104, due to capacitive coupling of bitlines to the plate lines.

The system 101 initially operates to charge capacitors in the precharge circuit 101a and the bump up circuit 101b to the supply voltage Vdd while the non-selected drivers 119 hold the associated platelines PL65–PL512 at 0V. At the beginning of the first time period T1, the capacitor in the precharge circuit 101a is coupled with the non-selected drivers 119, thereby raising the non-selected plateline voltage levels as shown in FIG. 4C. As the selected platelines PL1–PL64 are pulsed to Vdd, the non-selected plateline voltages also rise somewhat, to the level V1 (e.g., about 0.2 V in one implementation). When the selected plateline pulse PL1–PL65 is discontinued during T1, the non-selected plateline voltage will again fall slightly as shown in FIG. 4C.

At the start of the second time period T2 (e.g., generally at the same time as the sense amp enable signal SE is activated), the charged capacitor of the bump up circuit 101b is also coupled to the non-selected plateline drivers 119, whereby the non-selected plateline signal rises to V2. The bump down circuit 101c includes a capacitor coupled to Vss (e.g., 0V). Because of process variations during fabrication of the device 102, the plateline and charge sharing capacitance can vary from die to die. In order to modulate, control, and/or program the final V1 and V2 voltage levels, one or more bump down circuits 101c can be used to lower the V1 and/or V2 voltage levels. Similarly, by providing one or more bump up circuits 101b, the V1 and/or V2 levels can be raised, wherein one, some, or all of the bump up and bump down circuits 101b, 101c can be programmatically employed in a given device 102. In one example, such programmable bump up circuits 101b and/or bump down circuits 101c can be programmed for each die using at wafer test or package testing stages of fabrication before the die is shipped. Moreover, any suitable method can be used to program the bump up and/or bump down circuits 101b, 101c within the scope of the invention, including but not limited to eFuse, laser fuse, FeRAM data storage or any other non-volatile storage method.

At the end of T2, the voltage on the non-selected platelines is reduced to Vss. Other implementations are possible, wherein the illustrated system 101 is exemplary only. The non-selected plateline pulse system 101 may be constructed using any suitable logic or other circuitry, including timers, gates, programmable circuit elements, ferroelectric memory registers, and power circuitry, so as to activate one or more non-selected platelines in the array 104 during all or a portion of a read, restore, or write operation so as to provide biasing to the corresponding cell storage nodes, thereby inhibiting the above mentioned storage node disturbances, and may be separate or be provided as part of the control system or circuitry 122 in the device 102.

Similar to several other memory devices, after the power is initially applied to the device 102, the ferroelectric memory circuits typically go into an active standby state (or mode) and remain in this state until the device 102 receives a chip enable (CE) signal to activate or initiate a memory access operation. During the active standby state, various nodes are biased appropriately depending upon the circuit requirements. In preferred exemplary implementations which utilize n-channel (NMOS) cell transistors, the platelines and the p-type substrate are typically biased at 0V (Vss or ground) in the active standby state, although this is not a strict requirement of the invention. For an implementation which utilizes p-channel (PMOS) cell transistors, the platelines and the n-type substrate would typically be biased at Vdd in the active standby state. Activating a plateline during a memory access refers to applying a voltage (voltage pulse) or signal to the plateline different from that in the active standby state. The plateline signal voltage when it is activated, refers to the difference between the plateline voltage of the activated state and that of the active standby state. Between two accesses, the plateline voltage typically returns to its active standby state value and therefore it is also referred to as a voltage pulse and its value is determined with respect to the plateline voltage value in active standby state.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for accessing ferroelectric memory cells in a ferroelectric memory device, the method comprising:
    performing a memory access operation to access one or more selected ferroelectric memory cells associated with a selected plateline in a ferroelectric memory array; and
    biasing a storage node of a plurality of non-selected ferroelectric memory cells in the ferroelectric memory array during at least a portion of the memory access operation by activating a plurality of non-selected platelines that are associated with the non-selected ferroelectric memory cells during at least a portion of the memory access operation.

2. The method of claim 1, wherein activating the non-selected platelines comprises applying a non-zero voltage signal to the non-selected platelines during at least a portion of the memory access operation.

3. The method of claim 2, wherein applying the non-zero voltage signal comprises:
    applying a first voltage to the non-selected platelines during a first time period; and
    applying a second voltage to the non-selected platelines during a second time period, wherein at least a portion of the first time period is during the memory access operation, wherein at least a portion of the second time period is during the memory access operation, and wherein the second voltage is greater than the first voltage.

4. The method of claim 3, wherein a sense amp is enabled during at least a portion of the second time period.

5. The method of claim 2, wherein applying the non-zero voltage signal comprises applying a positive voltage pulse to the non-selected platelines during at least a portion of the memory access operation.

6. The method of claim 5, wherein applying the positive voltage pulse comprises:
    applying a first positive voltage to the non-selected platelines during a first time period; and
    applying a second positive voltage to the non-selected platelines during a second time period, wherein at least a portion of the first time period is during the memory access operation, wherein at least a portion of the second time period is during the memory access operation, and wherein the second positive voltage is greater than the first positive voltage.

7. A method for mitigating ferroelectric memory cell storage node disturbance, the method comprising:
    biasing a storage node of a plurality of non-selected ferroelectric memory cells so as to mitigate charge exchange between the storage node and a bitline during at least a portion of a memory access operation by activating a plurality of non-selected platelines that are associated with the non-selected ferroelectric memory cells during at least a portion of the memory access operation.

8. The method of claim 7, wherein activating the non-selected platelines comprises applying a non-zero voltage signal to the non-selected platelines during at least a portion of the memory access operation.

9. The method of claim 8, wherein applying the non-zero voltage signal comprises:
    applying a first voltage to the non-selected platelines during a first time period; and
    applying a second voltage to the non-selected platelines during a second time period, wherein at least a portion of the first time period is during the memory access operation, wherein at least a portion of the second time period is during the memory access operation, and wherein the second voltage is greater than the first voltage.

10. A ferroelectric memory device, comprising:
    an array of ferroelectric memory cells arranged in rows and columns with rows of the memory cells being coupled with a corresponding wordline and a plateline and columns of cells being coupled along corresponding bitlines or pairs of complementary bitlines, the individual ferroelectric memory cells comprising:
        a ferroelectric capacitor coupled between a corresponding plateline and a storage node; and a cell transistor coupled with the storage node, a corresponding bitline, and a corresponding wordline, the cell transistor being adapted to selectively couple the storage node with the corresponding bitline according to a wordline signal on the corresponding wordline when the corresponding array row is selected; and a control system coupled with the array, the control system being adapted to bias a storage node of a non-selected ferroelectric memory cell in the ferroelectric memory array during at least a portion of a memory access operation, wherein the control system comprises a non-selected plateline pulse system coupled with the array, the non-selected plateline pulse system being adapted to activate a plurality of platelines coupled with a plurality of non-selected ferroelectric memory cells during at least a portion of the memory access operation.

11. The device of claim 10, wherein the non-selected plateline pulse system comprises a charge-sharing circuit that provides a non-selected plateline pulse signal to a plurality of plateline driver circuits associated with the non-selected ferroelectric memory cells during at least a portion of the memory access operation.

12. The device of claim 11, wherein the charge-sharing circuit provides a non-selected plateline pulse signal comprising a first voltage during a first time period and a second voltage during a second time period, wherein at least a portion of the first time period is during the memory access operation, wherein at least a portion of the second time period is during the memory access operation, and wherein the second voltage is greater than the first voltage.

13. The device of claim 10, wherein the array of ferroelectric memory cells comprises a plurality of plate groups individually comprising a group of ferroelectric memory cells along a plurality of wordlines, the cells in a plate group being coupled with a common plateline, wherein the control system is adapted to bias storage nodes of non-selected ferroelectric memory cells a plurality of non-selected plate groups in the ferroelectric memory array during at least a portion of a memory access operation.

14. A system for mitigating ferroelectric memory cell storage node disturbance in a semiconductor device, comprising:

a non-selected plateline pulse system coupled with a ferroelectric memory array in the device, the non-selected plateline pulse system being adapted to activate a plurality of platelines coupled with a plurality of non-selected ferroelectric memory cells in the array during at least a portion of a memory access operation.

15. The system of claim 14, wherein the non-selected plateline pulse system comprises a charge-sharing circuit that provides a non-selected plateline pulse signal to a plurality of plateline driver circuits associated with the non-selected ferroelectric memory cells during at least a portion of the memory access operation.

16. The system of claim 15, wherein the charge-sharing circuit provides a non-selected plateline pulse signal comprising a first voltage during a first time period and a second voltage during a second time period, wherein at least a portion of the first time period is during the memory access operation, wherein at least a portion of the second time period is during the memory access operation, and wherein the second voltage is greater than the first voltage.

17. The system of claim 14, wherein the non-selected plateline pulse system is adapted to provide a non-zero voltage signal to the platelines coupled with the non-selected ferroelectric memory cells in the array during at least a portion of the memory access operation.

18. The system of claim 17, wherein the non-zero voltage signal comprises a first voltage during a first time period and a second voltage during a second time period, wherein at least a portion of the first time period is during the memory access operation, wherein at least a portion of the second time period is during the memory access operation, and wherein the second voltage is greater than the first voltage.

* * * * *